(12) United States Patent
Egashira et al.

(10) Patent No.: US 7,412,981 B2
(45) Date of Patent: *Aug. 19, 2008

(54) LIQUID PROCESSING APPARATUS AND METHOD

(75) Inventors: Koji Egashira, Tosu (JP); Yuji Kamikawa, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/545,471

(22) Filed: Oct. 11, 2006

(65) Prior Publication Data

US 2007/0028950 A1 Feb. 8, 2007

Related U.S. Application Data

(63) Continuation of application No. 09/801,106, filed on Feb. 28, 2001.

(30) Foreign Application Priority Data

Feb. 29, 2000 (JP) ............................... 2000-53402

(51) Int. Cl.
*B08B 3/02* (2006.01)
(52) U.S. Cl. ....................... 134/153; 134/198; 134/200; 134/902; 156/345.21; 156/345.55
(58) Field of Classification Search ................. 134/198, 134/199, 200, 902, 153, 157; 216/2, 92; 156/345.21, 345.51, 345.54, 345.55
See application file for complete search history.

(56) References Cited

U.S. PATENT DOCUMENTS

| | | | |
|---|---|---|---|
| 3,990,462 A * | 11/1976 | Elftmann et al. | ......... 134/102.1 |
| 4,027,686 A | 6/1977 | Shortes et al. | |
| 5,022,419 A | 6/1991 | Thompson et al. | |
| 5,154,199 A | 10/1992 | Thompson et al. | |
| 5,221,360 A | 6/1993 | Thompson et al. | |
| 5,224,503 A | 7/1993 | Thompson et al. | |
| 5,378,308 A | 1/1995 | Thoms | |
| 5,379,784 A | 1/1995 | Nishi et al. | |
| 6,039,057 A | 3/2000 | Doran | |
| 6,274,506 B1 | 8/2001 | Christenson et al. | |
| 6,284,043 B1 | 9/2001 | Takekuma | |
| 6,527,861 B2 | 3/2003 | Takekuma | |
| 6,797,076 B1 * | 9/2004 | Bryer | ......................... 134/33 |

FOREIGN PATENT DOCUMENTS

KR 1999-013579 2/1999

OTHER PUBLICATIONS

Korean Office Action, issued Apr. 26, 2006.

* cited by examiner

*Primary Examiner*—Joseph L Perrin
(74) *Attorney, Agent, or Firm*—Smith, Gambrell & Russell, LLP

(57) ABSTRACT

A liquid processing apparatus includes containers 26, 27, 26a, 26b surrounding processing chambers 51, 52 for accommodating a plurality of wafers W and nozzles 54, 56 for supplying a processing liquid to the substrates W in order to perform a liquid process. The nozzles 54, 56 are respectively equipped with a plurality of ejecting orifices 53, 55 capable of ejecting the processing liquid in a plane manner, allowing the substrates W to be processed uniformly and effectively.

10 Claims, 12 Drawing Sheets

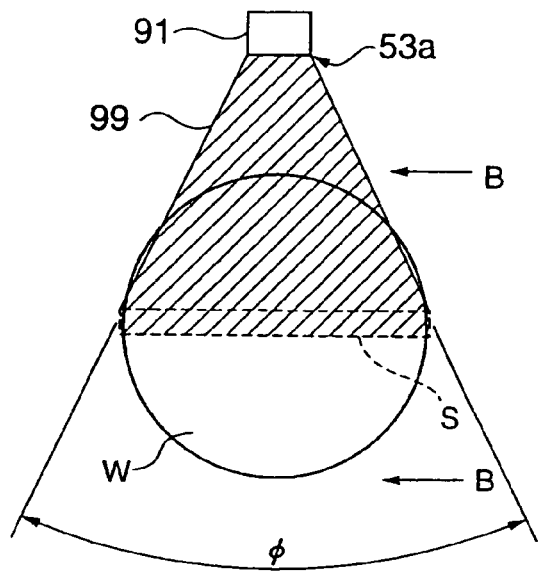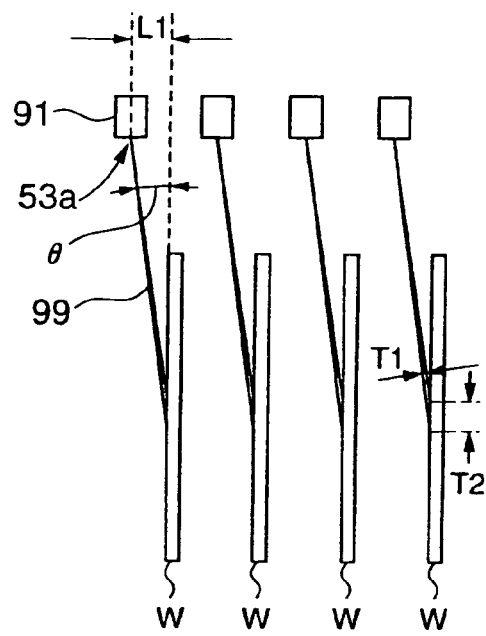
FIG. 8A  FIG. 8B
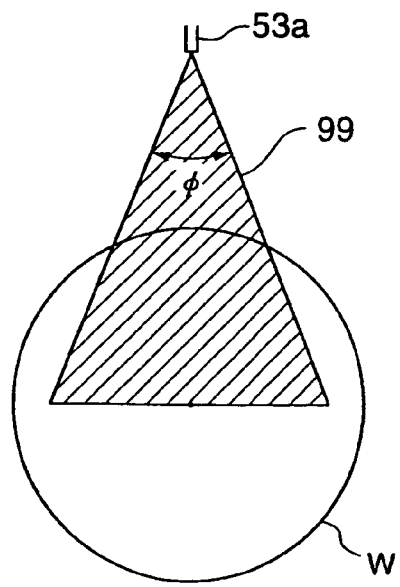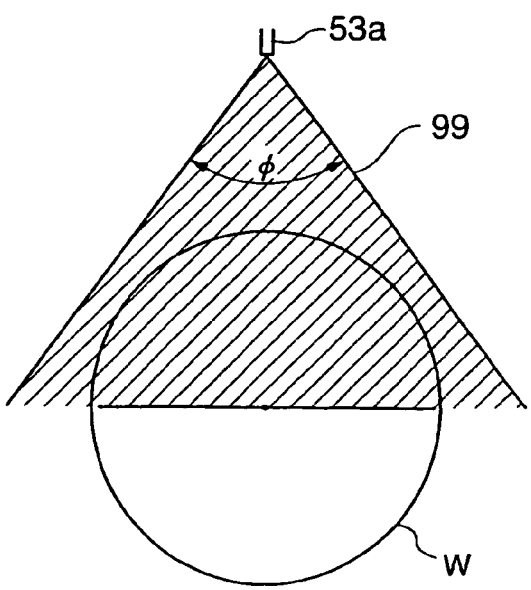
FIG. 8C  FIG. 8D

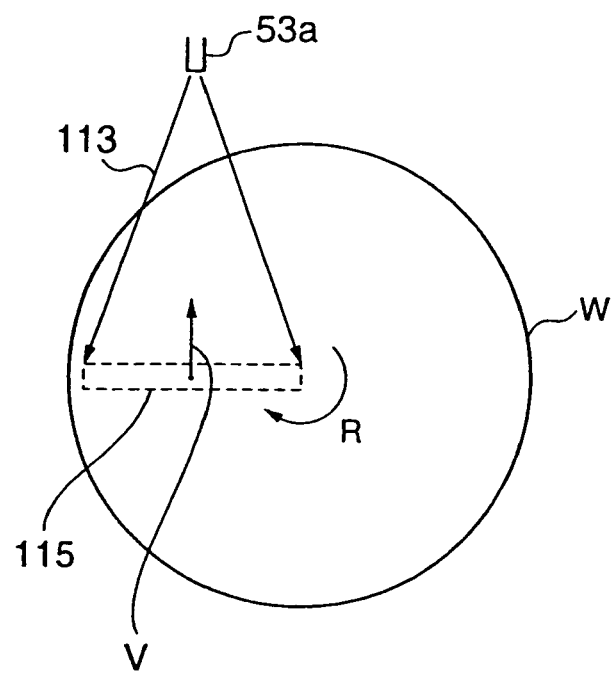
FIG. 14
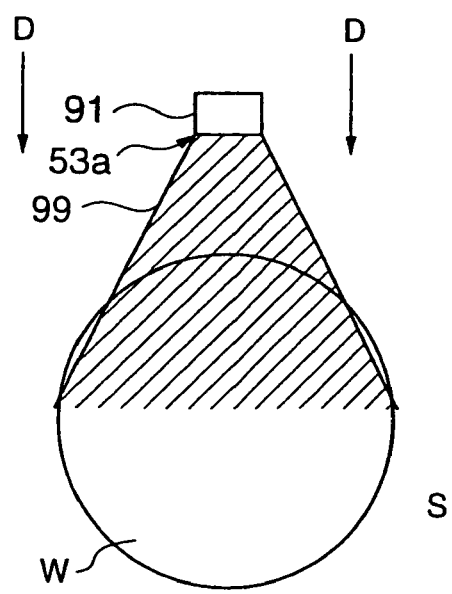 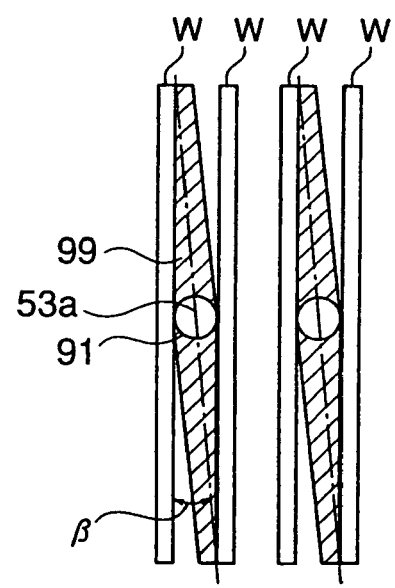
FIG. 15A  FIG. 15B

LIQUID PROCESSING APPARATUS AND METHOD

CROSS REFERENCE TO RELATED APPLICATION

This application is a continuation of Ser. No. 09/801,106, filed Feb. 28, 2001, which is being incorporated in its entirety herein by reference.

BACKGROUND OF THE INVENTION

1. Technical Field of the Invention

The present invention relates to a liquid processing apparatus for applying a designated liquid treatment on various substrates, for example, semiconductor wafers, LCD glass substrates, etc. and also relates to a liquid processing method thereof.

2. Description of the Related Art

Generally, in the manufacturing process of semiconductor devices, there is used a liquid processing apparatus for removing contaminations (e.g. particles, organic contaminations, metallic impurities, etc.), organic matter, oxide films from semiconductor wafers (which will be called "wafers etc." hereinafter) as the substrates.

For example, as a sort of "wafer" liquid processing apparatuses, there is known a liquid processing apparatus that includes a processing chamber liquid for accommodating a plurality of wafers and also processing the so-accommodated wafers in a batch. The known liquid processing apparatus is equipped with nozzles each having an ejecting orifice to eject a treatment liquid in substantially conical shape. While using the so-constructed nozzles, the liquid treatment is carried out by ejecting the treatment liquid against the wafers rotating in the in-plane directions, from their lateral upside of the wafers.

In the above-mentioned processing method, however, the treatment liquid does not come into effective contact with the surfaces of the wafers since a lot of liquid upon contact with the side faces of the wafers spatters on the inner wall of the processing chamber and the so-spattered liquid is drained along the inner wall subsequently. In other words, the above-mentioned processing apparatus and method have a problem of great consumption of the treatment liquid in order to remove the contaminations on the wafers, being accompanied with an extend time for processing the wafers furthermore. Additionally, in spite of great consumption of the treatment liquid, there still remains a possibility of insufficient removal of contaminations, easily causing the occurrence of unevenness in the liquid treatment.

SUMMARY OF THE INVENTION

Under the above-mentioned situation, the object of the present invention is to effectively eject the treatment liquid to the substrates, such as wafers, thereby to improve the efficiency in liquid treatment and also the quality of so-treated substrates.

According to the liquid processing apparatuses mentioned above, since the treatment liquid is ejected to the processing surfaces of each substrate as a target, it is possible to perform an uniform liquid treatment to the whole substrates with a reduced consumption of the treatment liquid in a short period while removing contaminations from the surfaces of the substrates effectively.

The first feature of the invention resides in the liquid processing apparatus comprising: a processing container formed so as to surround a processing chamber in which one or more substrates to be processed are accommodated; a nozzle for supplying the substrates with a processing liquid thereby to carry out a liquid process, the nozzle having ejecting orifices to eject the processing liquid in the form of a plane. Consequently, the above and other features and advantages of this invention will become apparent, and the invention itself will best be understood, from a study of the following description and appended claims, with reference had to the attached drawings showing preferred embodiments of the invention.

The second feature of the invention resides in that the substrates consist of a plurality of substrates whose processing surfaces to be processed thereon are arranged generally parallel with each other; and the ejecting orifices are juxtaposed with the plural substrates.

The third feature of the invention resides in that the substrates are arranged so as to be rotatable about substantial centers thereof.

The fourth feature of the invention resides in that the ejecting orifices are provided for the plural substrates, one by one.

The fifth feature of the invention resides in that the plural substrates are arranged in a manner that the two adjoining substrates in pairs have the processing surfaces facing each other; and the ejecting orifices are arranged one to the pair of substrates having the processing surfaces facing each other.

The sixth feature of the invention resides in that the nozzle is formed so as to eject the processing liquid among the plural substrates.

The seventh feature of the invention resides in that the nozzle is formed so as to eject the processing liquid obliquely to the processing surfaces of the plural substrates and also hit the processing liquid on substantial centers of the substrates.

The eighth feature of the invention resides in that the ejecting orifices are separated from the processing surfaces of the substrates in a direction perpendicular to the processing surfaces and also positioned radially outside of the substrates.

The ninth feature of the invention resides in that the ejecting orifices are formed so as to eject the processing liquid in a substantially fan-shaped pattern.

The tenth feature of the invention resides in that each of the substrates is in the form of a circular plate; and the processing liquid is ejected against each processing surface of the substrates so that a width of the plane-ejected processing liquid is generally equal to the diameter of the substrate, on the processing surface.

The eleventh feature of the invention resides in that the nozzle comprises: a nozzle body provided with a plurality of pedestals formed corresponding to the substrates to be processed; and nozzle members attached to the plural pedestals, the nozzle member having the ejecting orifices formed therein; wherein the pedestals are formed to incline so that the nozzle members can eject the processing liquid obliquely to the processing surfaces of the substrates.

The twelfth feature of the invention resides in that the nozzle has a nozzle body having the ejecting orifices formed therein, the ejecting orifices being inclined so as to eject the processing liquid obliquely to the processing surfaces of the substrates.

The 13th feature of the invention resides in that the ejecting orifices comprise: a plurality of main ejecting orifices arranged so as to correspond to the plural substrates respectively; and extra ejecting orifices arranged further outside of the outermost ones of the main ejecting orifices.

The 14th feature of the invention resides in that the nozzle includes a first nozzle and a second nozzle both of which are separated from each other in the circumferential direction of the substrates, the first nozzle having a plurality of first ejecting orifices to eject the processing liquid to alternately-positioned ones of the plural substrates to be processed, and the second nozzle having a plurality of second ejecting orifices to eject the processing liquid to alternately-positioned ones of the plural substrates except the alternately-positioned substrates charged by the first nozzle.

The 15th feature of the invention resides in that the ejecting orifices are arranged in a space above a horizontal plane including central axes of the substrates to be processed and also arranged in respective positions excluding an upper-projected space of the substrates.

The 16th feature of the invention resides in that the processing container includes a lower portion which is formed to have an inner face with an inclination intersecting the horizontal direction at an angle more than 5 degrees.

The 17th feature of the invention resides in that the nozzle has an inside nozzle passage providing the ejecting orifice with processing liquid, a sectional shape of the inside nozzle passage being rectangular.

The 18th feature of the invention resides in the liquid processing apparatus comprising: a wafer holding member for holding a plurality of wafers; a circular plate on which the wafer holding member is built; a processing container for accommodating the circular plate and the wafer holding member therein; and an ejecting orifice formed on an inner face of the processing container so as to face the circular plate, for supplying a processing liquid to the circular plate's surface facing the inner face of the processing container.

The 19th feature of the invention resides in the liquid processing method for supplying a substrate retained in a processing container with a processing liquid while using a nozzle having an ejecting orifice formed to eject the processing liquid in a plane, the method comprising the step of ejecting the processing liquid obliquely to a processing surface of the substrate and toward a substantial center of the processing surface.

The 20th feature of the invention resides in the liquid processing method for supplying a substrate retained in a processing container with a processing liquid while using a nozzle having an ejecting orifice formed to eject the processing liquid in a plane, the method comprising the step of ejecting the processing liquid adjacently to the substrate and along a processing surface of the substrate.

BRIEF DESCRIPTION OF THE DRAWINGS

FIG. 8A is an explanatory view of the treatment liquid ejected from an ejecting orifice from the axial direction of the wafer; FIG. 8B is a diagram viewed from the directions of arrows B, B of FIG. 8A; FIG. 8C is a view similar to FIG. 8A, showing a case of an ejecting angle smaller than the diameter of the wafer; FIG. 8D is a view similar to FIG. 8A, showing a case of the ejecting angle larger than the diameter of the wafer;

FIG. 14 is a view showing the condition that the discharge area of the treatment liquid is half of the diameter of the wafer;

FIG. 15A is a view from the axial direction of the wafer, showing a case of processing two sheets of wafers by a single ejecting orifice; and FIG. 15B is a view from the directions of D, D of FIG. 15A.

DESCRIPTION OF THE PREFERRED EMBODIMENT

With reference to drawings, embodiments of the present invention will be described below. Although the liquid processing apparatus of the invention is applicable to a cleaner of various substrates, a liquid-coater thereof, etc., the embodiments will be explained while taking example by a cleaning apparatus for consistently loading, washing, drying and unloading semiconductor wafers in batch.

Figure 1:
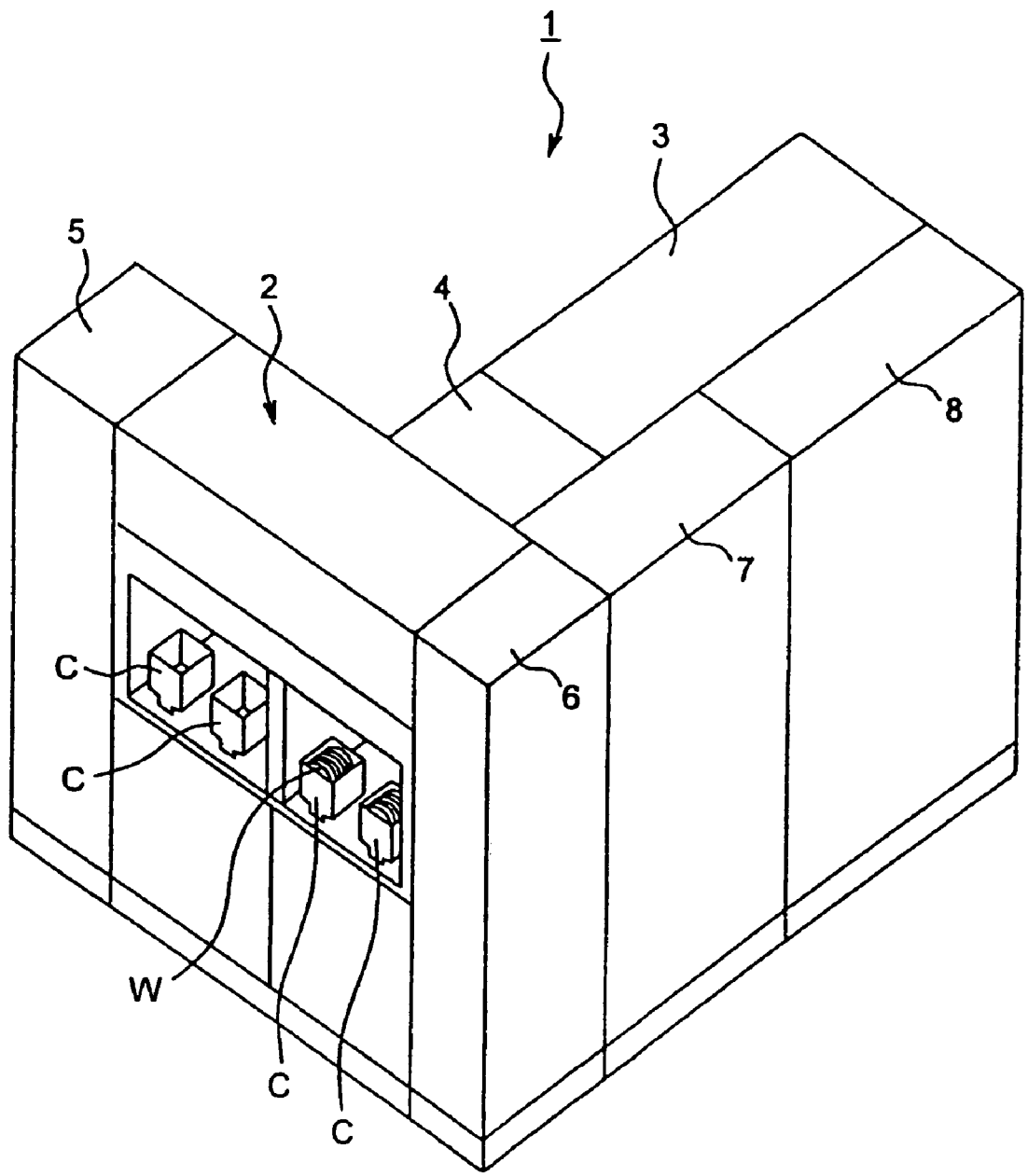
FIG. 1 is a perspective view showing one example of a cleaning apparatus to which the present invention is applied.
Figure 2:
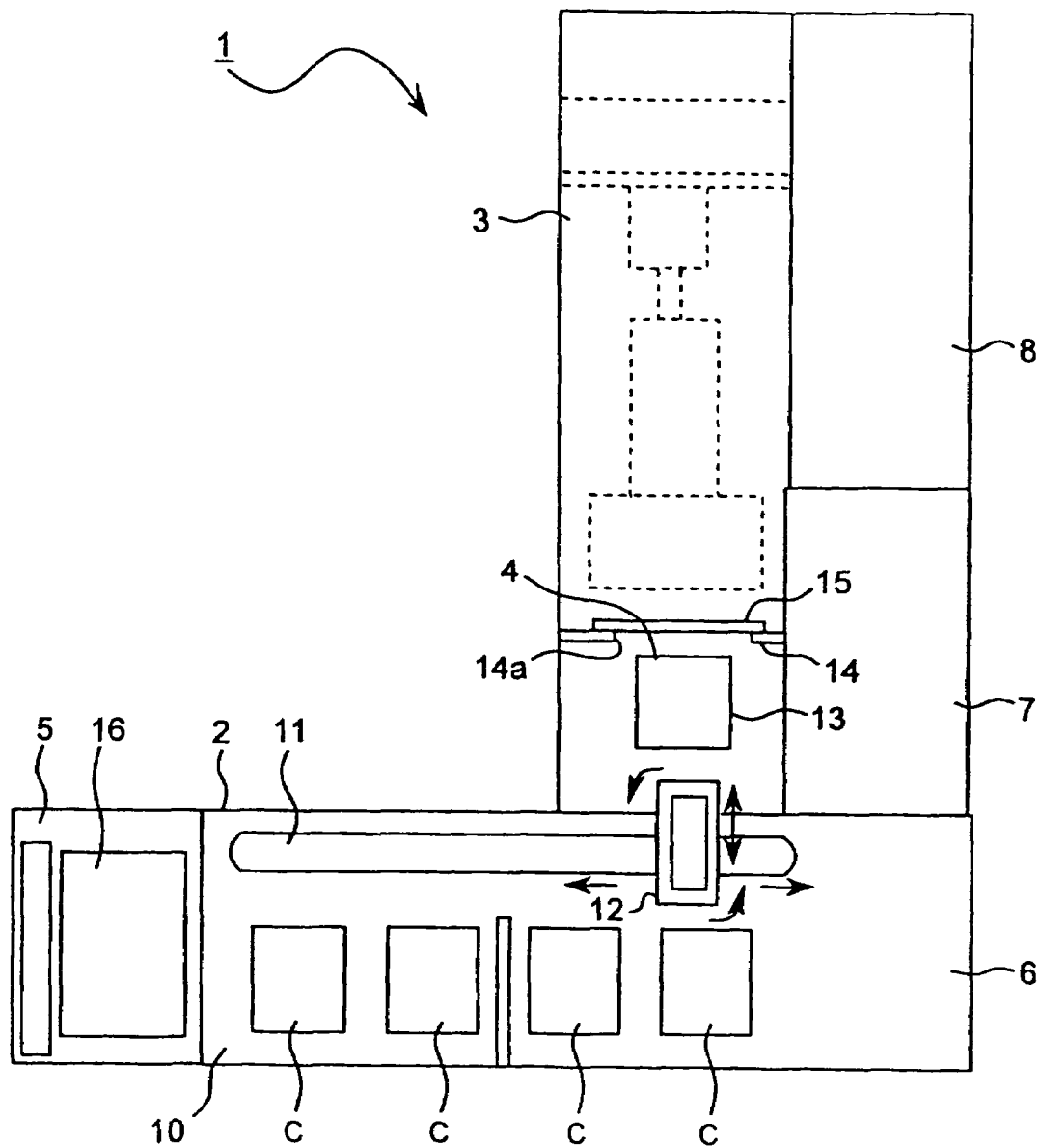
FIG. 2 is a plan view showing the example of the cleaning apparatus to which the present invention is applied.

FIG. 1 is a perspective view of the cleaning apparatus in accordance with the embodiment of the invention. FIG. 2 is a plan view of the cleaning apparatus of the embodiment. As shown in FIGS. 1 and 2, the cleaning apparatus 1 includes an in/out port (container loading/unloading section) 2 for loading and unloading carriers (substrate container) C capable of accommodating the wafers W therein, a cleaning unit 3 for washing and drying the wafers W subsequently, a stage section 4 disposed between the in/out port 2 and the cleaning unit 3 to carry out the loading/unloading of the carriers C with respect to the cleaning unit 3, a carrier cleaning unit 5 for cleaning the carriers C and a carrier stocking unit 6 for stocking a plurality of carriers C. Note, reference numerals 7 and 7 denote a power unit and a chemical tank box, respectively.

The in/out port 2 has a mount table 10 for mounting four carriers C thereon and a carrier conveyer mechanism 12 which is movable on a conveyer path 11 built along the arrangement of the carriers C in a row, for conveying the carrier C on the table 10 to the stage section 4 and also conveying the carrier C from the stage section 4 to the mount table 10. The carrier C is capable of accommodating, for example, twenty-six sheets of wafers W in vertical arrangements.

The stage section 4 is provided with a stage 13 for mounting the carrier C thereon. In processing, the carrier C, which has been brought from the in/out port 2 to the stage 13, is loaded into the cleaning unit 3 by a carrier conveyer mechanism (described later) employing a not-shown actuator cylinder and conversely, the carrier C in the cleaning unit 3 is discharged to the stage 13 through the above carrier conveyer mechanism.

Note, since the carrier C is moved from the table 10 onto the stage 13 with the rotation of an arm (not shown) of the carrier conveyer mechanism 12, the direction of the carrier C on the stage 13 is opposite to that of the carrier C on the table 10. Therefore, the stage 13 is provided with a turning mechanism (not shown) for reversing the direction of the carrier C.

A partition wall 14 is arranged between the stage section 4 and the cleaning unit 3, provided with an opening 14a for loading and unloading the carrier C therethrough. The opening 14a can be closed by a shutter 15. During processing the wafers W, the shutter 15 is closed. While, in loading or unloading the carrier C, then the shutter 15 is opened.

The carrier cleaning unit 5 is equipped with a carrier cleaning bath 16 for cleaning the carrier C emptied as a result of taking out the wafers W at the cleaning unit 3.

The carrier stocking unit 6 is provided in order to allow the carrier C having the wafers W before cleaning or the emptied carrier C having the taken-out wafers W before cleaning to wait for the next-coming process temporarily and also allow the emptied carrier C for accommodating the cleaned wafers w to wait in advance. The carrier stocking unit 6 is adapted so as to stock a plurality of carriers C vertically. Further, the carrier stocking unit 6 is equipped with a carrier moving mechanism (not shown) for mounting a specified carrier C on the table 10 and also stocking the carrier C in a designated position in a stack of carriers C.

Figure 3:
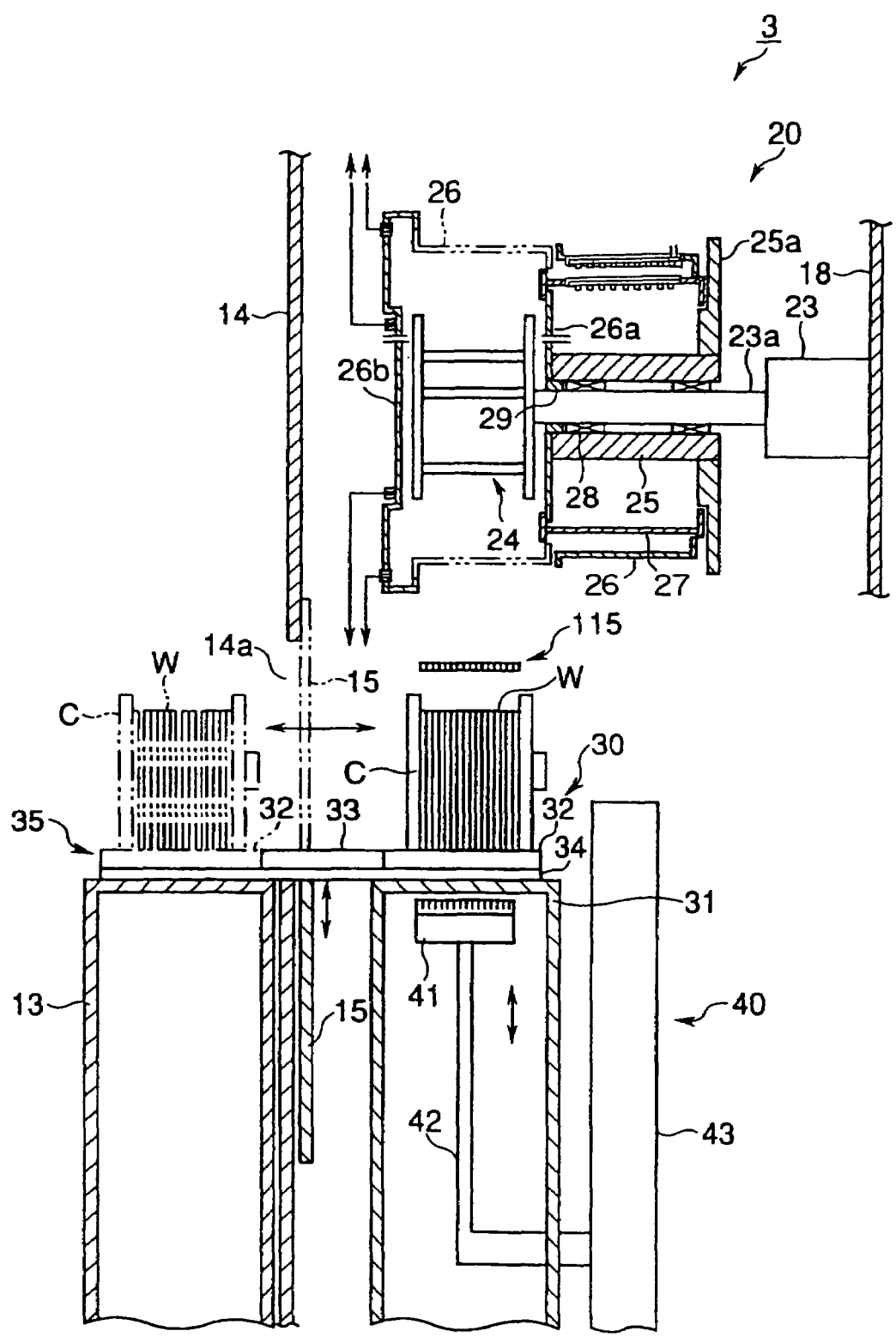
FIG. 3 is a sectional view showing a cleaning unit in accordance with one embodiment of the present invention.
Figure 4:
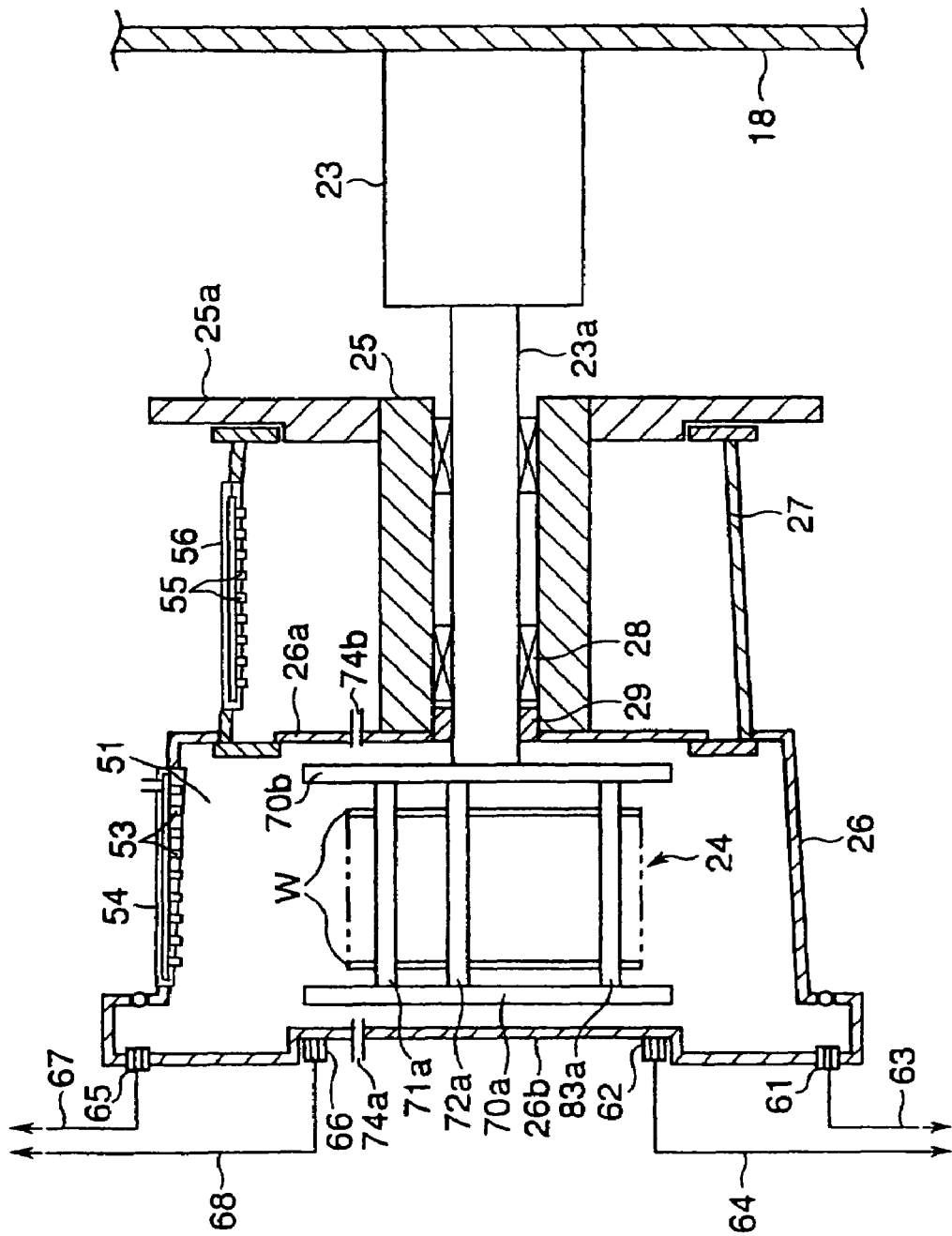
FIG. 4 is a sectional view showing the arrangement where an inner chamber is withdrawn from an outer chamber in the cleaning unit of FIG. 3.
Figure 5:
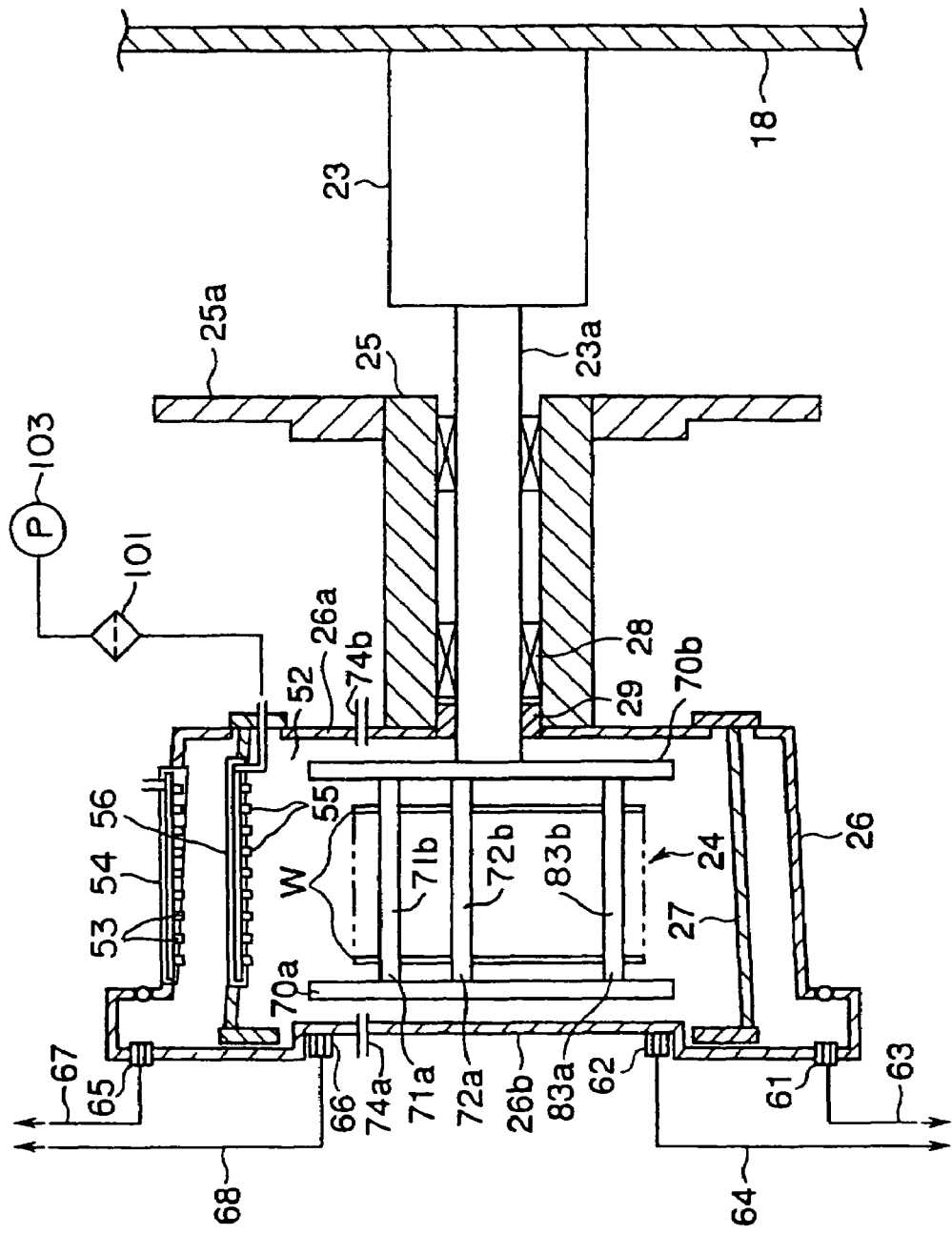
FIG. 5 is a sectional view showing the arrangement where the inner chamber is arranged inside the outer chamber in the cleaning unit of FIG. 3.

Next, the cleaning unit 3 will be described. FIG. 3 is a sectional view showing the interior of the cleaning unit 3. FIGS. 3 and 4 are sectional views both showing a cleaning part of the cleaning unit 3. In detail, FIG. 4 illustrates a condition that an inner chamber 27 is withdrawn out of an outer chamber 26. Note, such a positioning of the cleaning part will be called "turnout position" hereinafter. While, FIG. 5 illustrates another condition that the inner chamber 27 is arranged inside the outer chamber 26. Also noted, this positioning of the cleaning part will be called "processing position" hereinafter.

Inside the cleaning unit 3, there are arranged, as shown in FIG. 3, a cleaning part 20, a carrier waiting part 30 allowing the carrier C to wait just below the cleaning part 20 and a wafer moving mechanism 40 which elevates the wafers W in the carrier C waiting at the carrier waiting part 30 thereby to move the so-elevated wafers w to the cleaning part 20 and which also carries the wafers W of the cleaning part 20 to move them into the carrier C at the carrier waiting part 30.

The carrier waiting part 30 includes a stage 31 for mounting a slidable stage 32 of a carrier conveyer mechanism 35 thereon, allowing the carrier C to wait on the stage 31. The stage 31 forming the carrier waiting part 30 is arranged just below a rotor 24. As shown in FIG. 3, on the wafers' way above the carrier waiting part 30, there is provided a wafer detecting part 115 that comprises optical sensors in several pairs each consisting of an emitter and a receptor between which a wafers' path is interposed both in front and the in the rear. When the wafers pass through the wafer detecting part 115, it is carried out to confirm the number of wafers W and the existence of a wafer(s) being carried irregularly, so-called "jump-slot" wafer(s).

The wafer moving mechanism 40 has a wafer holding member 41 for holding the wafers W, a supporting rod 42 for supporting the wafer holding member 41 and an elevator unit 43 for moving the wafer holding member 41 up and down through the supporting rod 42. By rising the wafer holding member 41 by the elevator unit 43, the uncleaned wafers W accommodated in the carrier C at the carrier waiting part 30 can be moved into the rotor 24 at the cleaning part 20. Alternatively, by falling the wafer holding member 41 by the elevator unit 43, the cleaned wafers W in the rotor 24 can be moved to the carrier C at the carrier waiting part 30.

The cleaning part 20 is provided in order to remove resist-mask, polymer layer as etching residual, etc. from the wafers W after etching. The cleaning part 20 includes a support wall 10 standing vertically, a motor 23 fixed on the support wall 18 to have a horizontal rotating shaft 23a, a rotor 24 secured on the rotating shaft 23a, a cylindrical pipe 25 surrounding the shaft 23a of the motor 23, the above outer chamber 26 formed to surround the rotor 24 and the above inner chamber 27 for carrying out the liquid treatment while being disposed inside the outer chamber 26.

The rotor 24 is capable of carrying a plurality (e.g. 26 pieces) of wafers W each arranged vertically and all arranged in the horizontal direction. The rotor 24 is rotated by the motor 23 through the rotating shaft 23a, together with the wafers W which are engaged by engagement members 71a, 71b (not shown: behind the member 71a), 72a and 72b (not shown: behind the member 72a) and also supported by supporting members 83a and 83b (not shown: behind the member 83a). The engagement members 71a, 71b, 72a and 72b are bridged between a pair of circular plates 70a and 70b at a predetermined distance.

The outer chamber 26 in the form of a cylinder is constructed so as to move between the above processing position (shown with chain double-dashed lines of FIG. 3) and the above turnout position (shown with solid lines of FIG. 3). In loading and unloading the wafers W, the outer chamber 26 is arranged in the turnout position, as shown in FIG. 3. As shown in FIG. 4, when the outer chamber 26 is in the processing position while the inner chamber 27 is in the turnout position, there is defined a processing space 51 by the outer chamber 26, a vertical wall 26a on the side of the motor 23 and another vertical wall 26b on the tip side of the cleaning part 20 (see FIG. 4). The vertical wall 26a is attached to the cylindrical pipe 25. A bearing 28 is provided between the cylindrical pipe 25 and the rotating shaft 23a. The vertical wall 26a and the leading end of the pipe 25 are sealed up with a labyrinth seal 29 to prevent particles about the motor 23 from entering into the processing space 51. On the end of the pipe 25 close to the motor 23, an engagement member 25a is provided for engagement with the outer chamber 26 and the inner chamber 27 alike.

The inner chamber 27 in the form of a cylinder has a diameter smaller than that of the outer chamber 26. The inner chamber 27 is constructed so as to be movable between the processing position shown in FIG. 5 and the turnout position (outside the pipe 25) shown in FIGS. 3 and 4. In loading and unloading the wafers W, the inner chamber 27 is arranged in the turnout position, together with the outer cylinder 26. As shown in FIG. 5, when the inner chamber 27 is in the processing position, there is defined another processing space 52 by the inner chamber 27 and the vertical walls 26a and 26b. Note, the processing chambers 51, 52 are provided as being airtight spaces by seal arrangements.

In the vicinity of the top of the processing chamber 51, two discharging nozzles 54 with a number of ejecting orifices 53 are arranged in the horizontal direction while being attached to the vertical wall 26b. The nozzles 54 are capable of ejecting pure water, IPA, treatment liquids, such as various chemicals, $N_2$-gas (nitrogen gas), etc. from not-shown fluid sources.

In the vicinity of the top of the processing chamber 52, two discharging nozzles 56 with a number of ejecting orifices 55 are arranged in the horizontal direction while being attached to the inner chamber 27. The discharging nozzles 56 are connected with a diaphragm pump 103 through a filter 101. A not-shown fluid source is connected with the diaphragm pump 103. The filter 101 has a function of damping a pressure change of the so-supplied fluid, so that even if there is a pulsation in ejecting pressure from the diaphragm pump 103, the filter 101 can absorb the pulsation. That is, it is possible to eject the fluid through the discharging nozzles 56 uniformly, maintaining the uniformity in processing the wafers W. Meanwhile, if supplying the rotating wafers with the pulsatory treatment liquid, then the wafers are easily subjected to an uneven treatment due to a relationship between the rotating cycle of wafers and the pulsation of liquid. However, according to the above-mentioned apparatus, it is possible to prevent the occurrence of uneven treatment since the treatment liquid can be ejected by the filter 101 uniformly.

The discharging nozzles 56 are capable of ejecting various chemicals from not-shown sources, pure water, IPA, etc. It is advantageous that the nozzles 54 and 56 are made of fluorinated resin, for example, PTFE, PFA or stainless steel.

Note, the inner chamber 27 is provided, on an inner-and-upper wall thereof, with discharging nozzles (not shown) for cleaning respective faces of the circular plates 70a, 70b opposing the wafers W. The vertical walls 26a, 26b have discharging nozzles 74b, 74a arranged to clean the respective faces of the plates 70b, 70a opposing the vertical walls 26a, 26b, respectively. Mainly, these discharging nozzles 74a, 74b are operated to rinse various chemicals from the circular plates 70a, 70b by pure water. When drying the wafers W, $N_2$-gas is supplied from the nozzles 74a, 74b. As to each nozzle itself, it may be formed by either a conical-shaped nozzle capable of ejecting the treatment fluid conically or a fan-shaped nozzle capable of ejecting the liquid in the shape of a fan.

On the lower part of the vertical wall 26b, a first drain port 61 is provided to drain the so-used chemicals, pure water and IPA from the processing space 51 of FIG. 4. Above the first drain port 61, a second drain port 62 is arranged to drain the so-used chemicals, pure water and IPA from the processing space 52 of FIG. 5. The first and second drain port 61 and the second drain port 62 are connected to a first drain pipe 63 and a second drain pipe 64, respectively.

On the upper part of the vertical wall 26b, a first exhaust port 65 is arranged to exhaust the processing space 51 under the condition of FIG. 4. Under the first exhaust port 65, a second exhaust port 66 is arranged to exhaust the processing space 52 under the condition of FIG. 5. The first and second exhaust port 65 and the second exhaust port 66 are connected to a first exhaust pipe 67 and a second exhaust pipe 68, respectively.

Next, the discharging nozzles 54, 56 in accordance with one embodiment of the treatment liquid supplying mechanism will be described in detail. Due to the possibility of adopting the same structure for the discharging nozzles 54 and 56, their structures will be explained by that of the discharging nozzle 54 representatively.

Figure 6A:
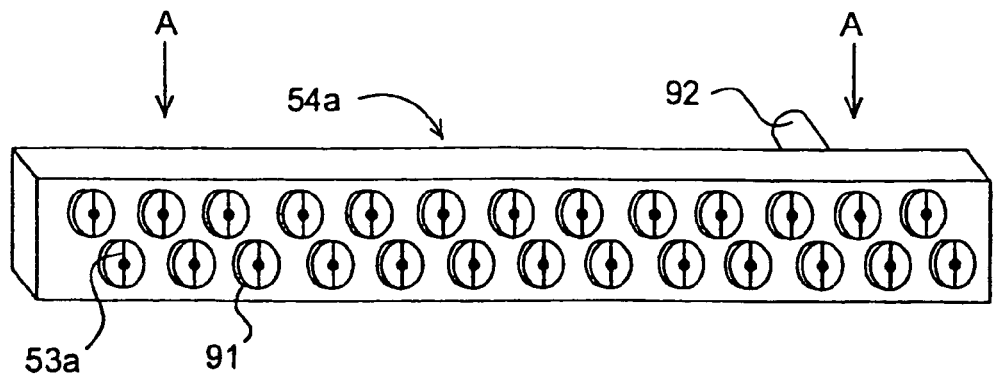
FIG. 6A is a perspective view showing one embodiment of a discharge nozzle.
Figure 6B:
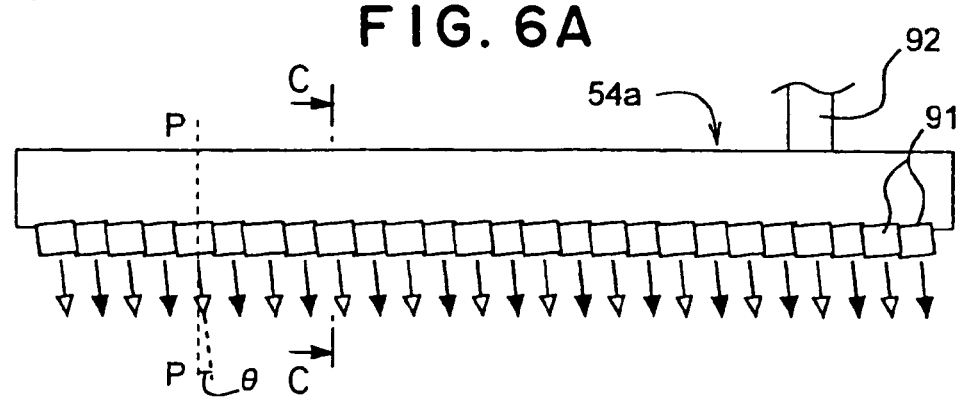
FIG. 6B is a view from the directions of arrows A, A of FIG. 6A.

FIG. 6A is a perspective view showing a nozzle 54a as one embodiment of the discharging nozzle 54. FIG. 6B is a view from arrows AA of FIG. 6A. The nozzle 54a is provided, on one side thereof, with a number of members 91 each having an ejecting orifice 53a. Each member 91 is designed so that the treatment liquid ejected from the single orifice 63a strikes only on the processing surface of the single wafer W. For example, the shown nozzle 54a has twenty-six ejecting orifices 53a formed to severally eject the treatment liquid to twenty-six wafers W which are carried in parallel with each other at regular intervals while having their processing surfaces directing to one side. Note, on the backside of the discharging nozzle 54a, there is arranged a supply pipe 92 for the treatment liquid.

As shown in FIG. 6B, the treatment liquid from each orifice 53a is ejected to the wafer W at an angle of 0 to the vertical direction shown by a broken line P-P of FIG. 6B (also see FIG. 8B). Therefore, as shown in FIGS. 6A and 6B, if the pedestal 154 of nozzle 54a for mounting the column-shaped members 91 could be fitted to the nozzle 54a with ease. Note, the members 91 can be secured to the nozzle 54a by means of screws or the like.

Figure 6C:
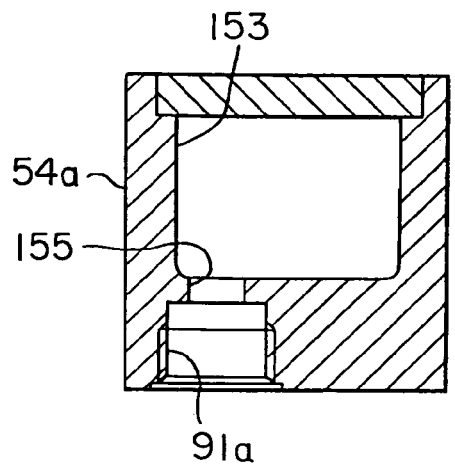
FIG. 6C is a sectional view along the line C-C of FIG. 6B.

FIG. 6C is a sectional view along the line C-C. Note, in this figure, the member 91 is omitted.

As shown in FIG. 6C, the nozzle 54a has an inside nozzle passage 153 therein through which the treatment liquid is passed. The inside nozzle passage 153 is shaped in such a way that the section of the inside nozzle passage 153 which is perpendicular to the extending direction of the inside nozzle passage 153 is rectangular. A branch passage 155 is formed extending from the inside nozzle passage 153 to the ejecting orifice 53a of the member 91. The branch passage 155 is provided with a connecting portion 91a to which the member 91 is connected.

The reason why the section of the inside nozzle passage 153 is shaped to be rectangular is that the flat shape of the ejection of the treatment liquid is not likely to be twisted because of the rectangular section and is likely to keep flatness of the shape of the ejection. On the other hand, if the sectional shape of the inside nozzle passage 153 is circle, the flat shape of ejection of the treatment liquid is twisted, so that the supply of the treatment liquid does not become uniform. Accordingly, this nozzle 54a adopts rectangular shape as the sectional shape of the inside nozzle passage 153. Therefore, it is possible to keep the shape of ejection flat, so it is possible to provide the wafer with the treatment liquid uniformly and prevent the treatment liquid from being wasted due to the deviation of the treatment liquid from the wafer.

In FIGS. 6A and 6B, the shown staggered arrangement of the orifices 53a comes from the consideration of the size of each member 91 and also the correspondence with the intervals of the wafers W. Therefore, with the modification of the members 91 in shape, the orifices 53a may be arranged in a row. In such a case, with the possibility of forming the thin discharging nozzle 54a, the arrangement space could be saved to miniaturize the processing chamber.

It should be noted that the row arrangement of the orifices 53a could be realized by elongating the interval carrying the wafers W. In such a case, however, the so-thinned nozzle would be elongated to increase a space required to carry the wafers W, causing the processing chamber and the processing apparatus to be large-sized, correspondingly.

Figure 7:
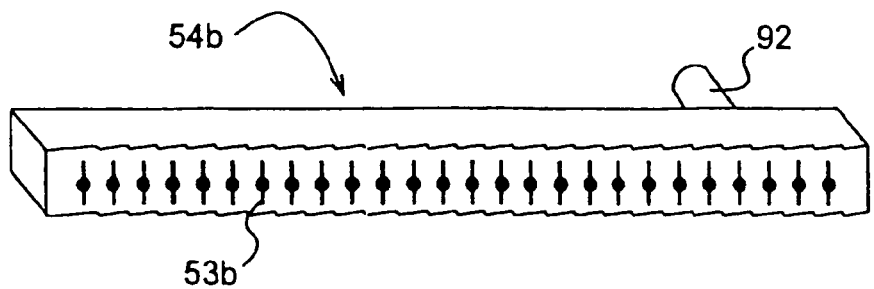
FIG. 7 is a perspective view showing another embodiment of the discharge nozzle.

FIG. 7 is a perspective view showing a discharging nozzle 54b in accordance with another embodiment of the nozzle 54. As shown in FIG. 7, orifices 53b may be formed in a body with the pedestal of the nozzle 54b directly. Then, the above formation would facilitate row-arrangement of the ejecting orifices 53b. Additionally, since there is no need to fit the members 91 to the nozzle 54b, the configuration can be small-sized.

With reference to the above-mentioned nozzle 54b, the ejecting form of the treatment liquid will be described below. FIGS. 8A and 8B show respective ejection forms of the treatment liquid ejected from each ejecting orifice 53a; FIG. 8A is a view in a direction perpendicular to the processing surface of the wafer W and FIG. 8B is a view in the directions of arrows B, B of FIG. 8A, showing four sheets of wafers W whose processing surfaces direct to one side, as one example. As shown in FIG. 8A, the treatment liquid from the ejecting orifice 53a is discharged so as to strike on the processing surface of the wafer W while spreading in a plane with a regular angle, accomplishing the liquid treatment on the wafers W.

The treatment liquid ejected in a plane (referred as "plane ejected liquid 99" hereinafter) has a constant thickness, of course. As shown in FIG. 8B, in a condition just before striking on the wafer W, the plane ejected liquid 99 has a thickness T1 of the order from 0.5 mm to 5 mm. While, in a condition after striking on the wafer W, a length T2 where the plane ejected liquid 99 strikes on the wafer W is larger than the thickness T1 and also changeable dependently of both thickness T1 and angle θ. Strictly speaking, respective planes of the plane ejected liquid(s) 99 from the orifices 53a are not parallel with each other; nevertheless the following descriptions are on the assumption that the above respective planes are substantially parallel with each other.

Besides, if the ejecting orifices are formed to be large in width, there would arise a problem to cause the discharging nozzle itself to be large-sized. Therefore, it is preferable that the discharging nozzle is provided with small ejecting orifices smaller and also a structure to eject the treatment liquid in a fan shape.

As shown in FIG. 8B, preferably, the plane ejected liquid 99 is ejected to strike on the substantial center of the wafer W at a predetermined angle of θ. When the plane ejected liquid 99 strikes on each wafer W at the predetermined angle, the collision therebetween exhibits a configuration in the form of a general line. Therefore, the above-mentioned condition of striking on the substantial center of the wafer W means that the treatment liquid 91 hits on the wafer W along its diametrical direction passing through the substantial center.

In other words, each wafer W is subjected to direct hitting of the treatment liquid in a wafer's portion S surrounded by a dotted line of FIG. 8A. Nevertheless, owing to the wafer's rotating in a designated direction, it can be subjected to the application of the treatment liquid uniformly.

In FIG. 8A, it is preferable to eject the treatment liquid from the orifice 53a with an ejecting angle φ to cover a diameter passing through the substantial center of the wafer W. If the angle φ is smaller than the diameter, then an unprocessed area is produced on the periphery of the wafer W, as shown in FIG. 8C. While, as shown in FIG. 8D, if the angle φ is larger than the diameter of the wafer W, then a wasteful area is produced over the wafer W, causing a drop in processing efficiency.

In this way, since the treatment liquid is ejected against each wafer's face at the designated angle, there is almost no possibility that the treatment liquid hits on the upper periphery of each wafer W and further flies in all directions. Consequently, the treatment liquid can be hit on the wafers W most effectively, accomplishing to save the treatment liquid and shorten the processing time. Furthermore, in accordance with the embodiment, since the treatment liquid hits on the wafers W with a high ejection pressure, it is possible to remove particles etc. adhering to the wafers' faces effectively.

Noted, the angle θ between the plane ejected liquid 99 and the processing surface of each wafer W can be altered in correspondence with the intervals of the wafers W. For example, when the distance between the adjoining wafers W is relatively long, the angle θ can be increased correspondingly. Nevertheless, in view that it is desirable to minimize the carrying space for the wafers W while maintaining to supply the treatment liquid to the wafers W uniformly, for example, the wafers W each having 8 inches in diameter are preferably arranged at regular intervals from 0.3 to 8 mm and at the angle θ from 0.8 to 1.3 degrees.

In order to allow the plane ejected liquid 99 to hit against each wafer W at the designated angle, each of the orifices 53a is positioned apart from the corresponding processing surface of the wafer W by a regular distance L1 in the direction perpendicular to the processing surface and also positioned outside of the wafer W in the diametrical direction. In other words, owing to the arrangement where each orifice 53a is not positioned just above the corresponding wafer W, there would be no possibility that the treatment liquid in the form of traces is remained on the wafer W even if the liquid drops from the orifice 53a.

Figure 9A:
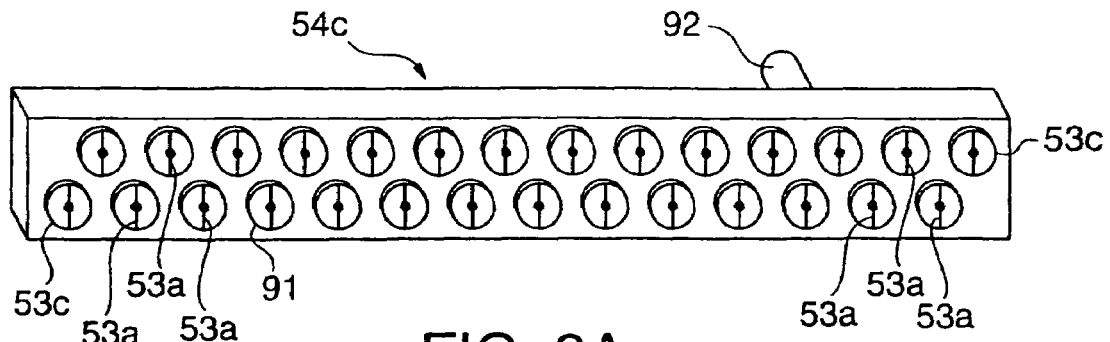
FIG. 9A is a perspective view showing the other embodiment of the discharge nozzle.
Figure 9B:
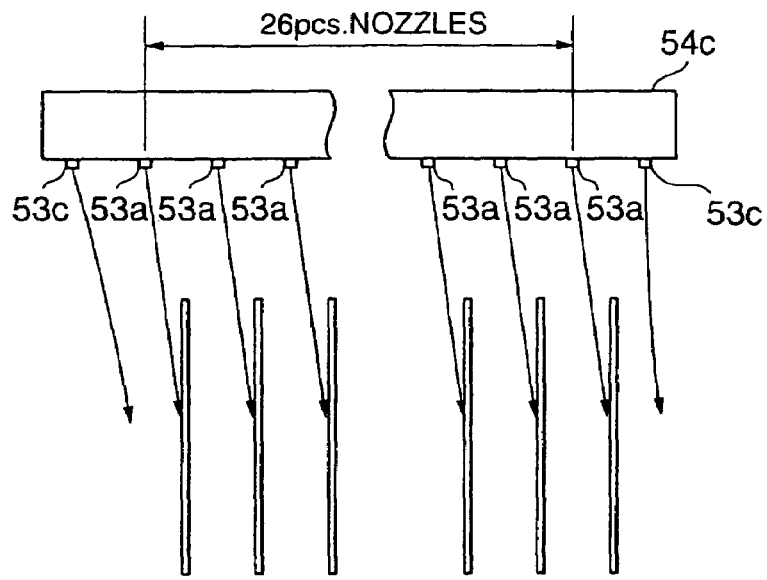
FIG. 9B is a view showing a condition that the ejecting nozzle of FIG. 9A is actually used to clean the wafers.
Figure 9C:
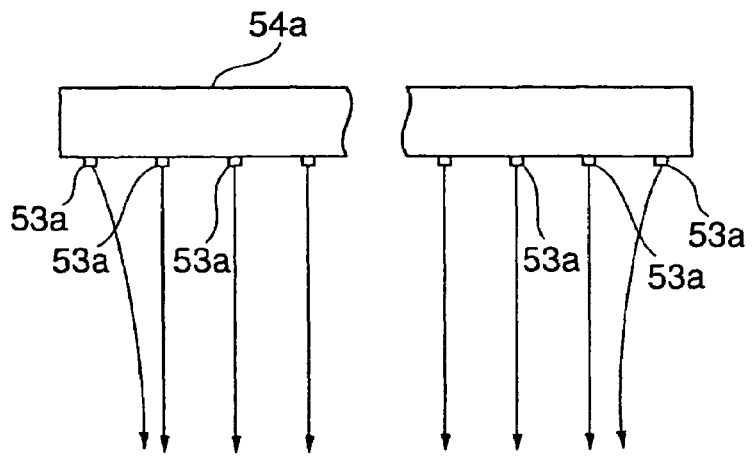
FIG. 9C is a view showing a condition that the treatment liquids ejected from the ejecting orifices on both sides of the nozzle of FIG. 9A are deviated.

Next, FIG. 9A shows a discharging nozzle 54c resulting from an improvement on the previous nozzle 54a of FIG. 6A. This nozzle 54c has not only twenty-six orifices for the previous nozzle 54a, but also two additional dummy orifices 53c respectively positioned outside the outermost orifices of the nozzle 54a in the longitudinal direction. The reason of provision of the orifices 53c is as follows. That is, as shown in FIG. 9C, the previous nozzle 54a of FIG. 6A has a tendency that the treatment liquid(s) ejected from the outermost orifices 53a are both deviated inwardly of the nozzle 54a in the longitudinal direction (Such a phenomenon is noted in the supply of the treatment liquid at a high pressure, in other words, high ejection speed). As a reason, it is supposed that an airflow due to the central ejecting current of the treatment liquid causes a difference in atmospheric pressure (pressure-difference) between the central part and the peripheral part in the row of wafers, so that the outermost ejecting currents are urged against the center part of the wafers in row exhibiting a relatively-small pressure. Thus, due to the above inward-deviation of ejecting currents on both sides of the nozzle, the conventional apparatus has a problem that the wafers on both sides of the row are easily subjected to uneven treatment in case of a high ejection speed of treatment liquid.

Repeatedly, the nozzle of FIG. 9A is provided with two additional dummy orifices 53c outside the outermost orifices 53a to overcome the above-mentioned problem. In operation, since these dummy orifices 53c are subjected to the above inward-deviation, the ejecting currents from the formal orifices 53a corresponding to the wafers can be prevented from inward-deviation.

Figure 10A:
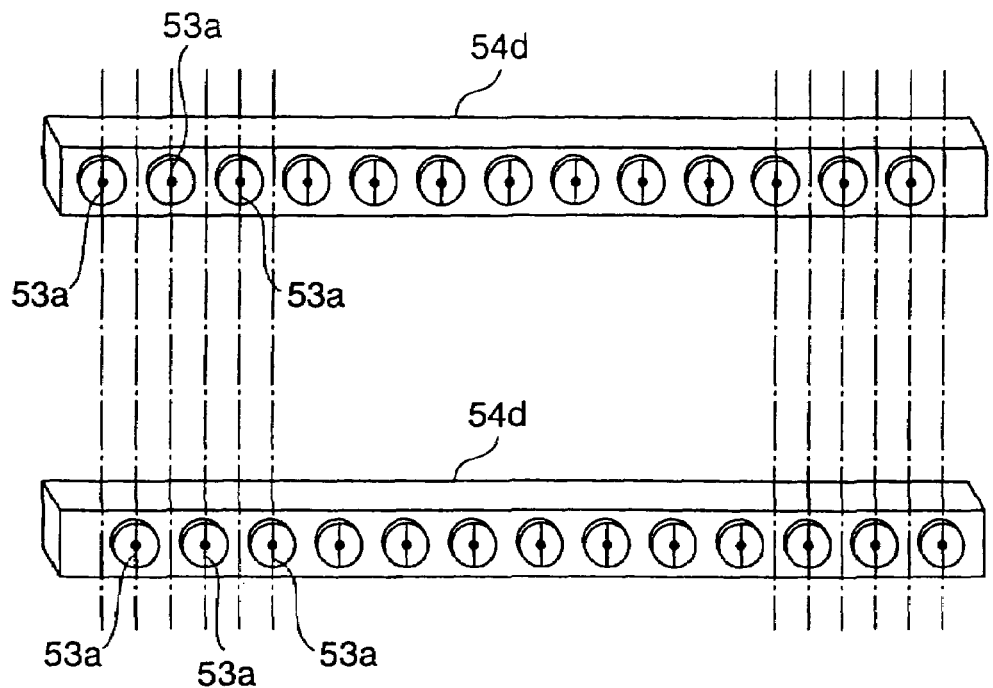
FIG. 10A is a perspective view showing a further embodiment of the discharge nozzles.
Figure 10B:
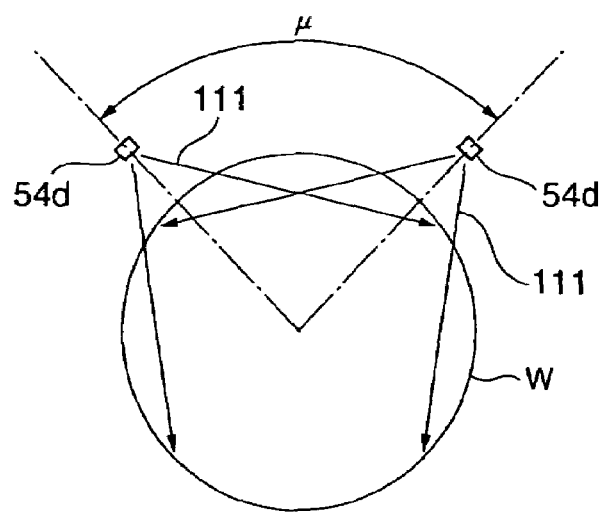
FIG. 10B is a view showing the circumferential arrangement of the discharge nozzles of FIG. 10A.

FIG. 10A shows a pair of discharging nozzles 54d resulting from an improvement on the previous nozzle 54a of FIG. 6A. According to the shown embodiment, the previous nozzle 54a with twenty-six orifices 53a in two rows is divided into two pieces, providing two nozzles 54d, 54d each having thirteen orifices 53a in one row. In this arrangement, the discharging nozzle 54d on one hand operates to eject the treatment liquid to the wafers in the order of an odd number, while the discharging nozzle 54d on the other hand operates to eject the treatment liquid to the wafers in the order of an even number. The nozzles 54d, 54d are separated from each other by an angle μ in the circumferential direction of the wafer W. With the arrangement, since the interval of the adjoining orifices with respect to the single nozzle 54d, in other words, the interval of adjoining ejecting currents is twice as long as that of adjoining ejecting currents of FIG. 9A, a great airflow is hard to occur at the central part of the wafers W in row. Consequently, it is possible to eliminate the above pressure-difference between the central part and the peripheral part with respect to the nozzle 54. The same thing could be said of the other discharging nozzle 54d. Therefore, in accordance with the shown embodiment, it is also possible to prevent the ejecting currents via the outermost orifices from being attracted to the central part (see FIG. 9C), whereby the application of liquid treatment on the wafers W can be equalized.

The advantageous positioning of the discharging nozzle(s) in the processing chamber will be described below. This arrangement is applicable to one relationship between the inner chamber 27 and the discharging nozzle 56 and another relationship between the outer chamber 26 and the nozzle 54 alike.

Figure 11:
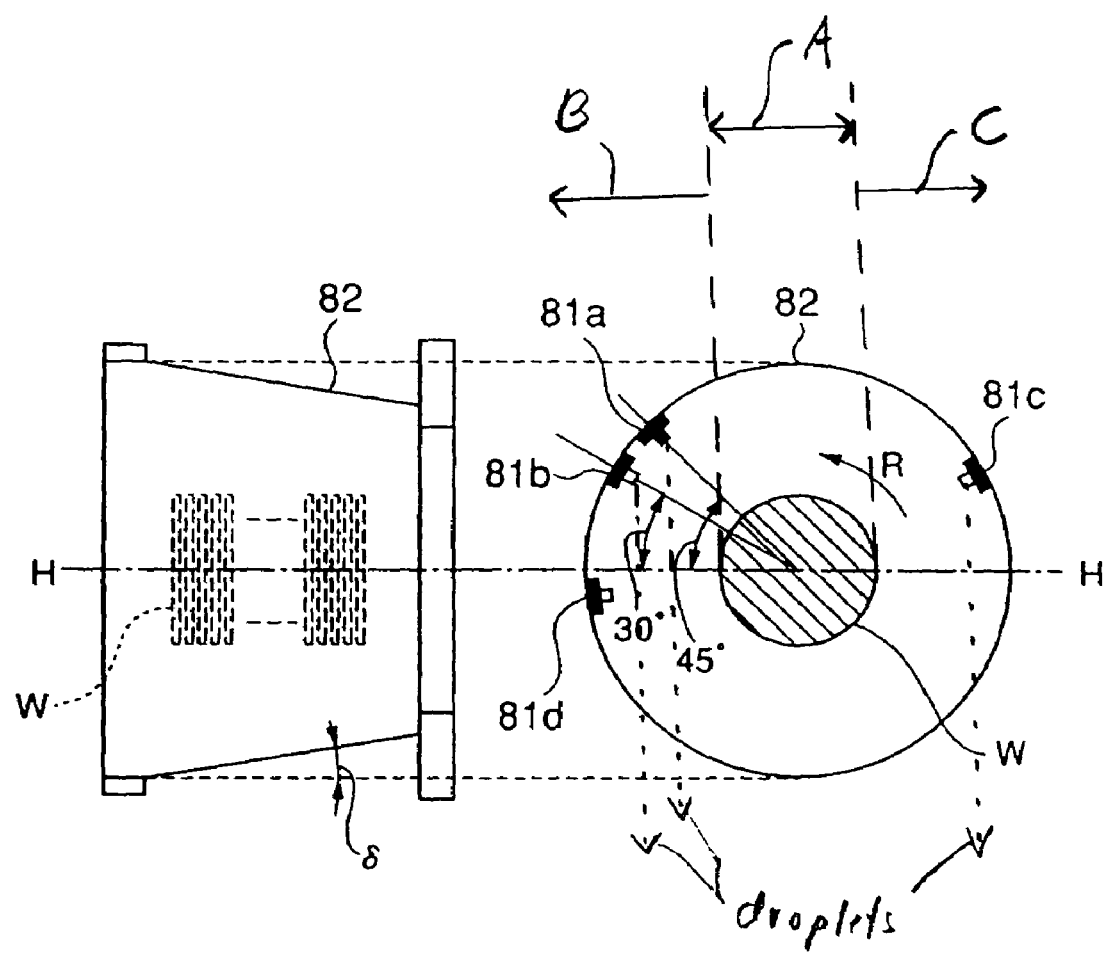
FIG. 11 is a view showing the suitability of the discharge nozzles against the wafer.

FIG. 11 is a diagram including sectional and front views of one chamber 82, also showing one form of the positioning of nozzles 81a to 81c. Noted, the nozzles 81a to 81c are not shown in the sectional view. The positioning of the nozzles 81a to 81c is not limited to the arrangement of FIG. 11 only. In the modification, the shown nozzle 81a may be replaced by the previous nozzle 54a ejecting the treatment liquid in a plane. Similarly, there may be arranged a discharging nozzle which can eject the treatment liquid in a conical shape, in charge of the nozzles 81b and 81c.

The cylindrical chamber 82 is provided, on its lower part at least, with an inclination for discharging the treatment liquid certainly. Preferably, this inclination angle $\delta$ is more than 3 degrees, more preferably, 5 degrees. While, to increase the inclination angle $\delta$ would cause the chamber 82 to be largesized. Therefore, it is also desirable that the inclination angle $\delta$ is less than 10 degrees. Although the shown cylinder has its upper part also formed with an inclination, this upside inclination is not always necessary for the chamber 82.

All the discharging nozzles 81a to 81c are arranged out of a wafers' "upside" area projected upwardly in plan view and also arranged in an "upper" area of the wafers in the horizontal position. The former positioning of the nozzles 81a to 81c outside the wafers' "upside" area means that the nozzles 81a to 81c are so positioned that even if being lowered vertically, they would not interfere with the wafers W. Further, the latter positioning of the nozzles 81a to 81c inside the "upper" area of the wafers in the horizontal position means that the nozzles 81a to 81c are positioned above a horizontal plane (shown with a two-dotted line of FIG. 11) passing through the centers of the wafers W being held in a designated position in the chamber 82.

Owing to the above-mentioned arrangement of the nozzles 81a to 81c, it is possible to prevent the droplets of treatment liquid from adhering to the wafers W. In detail, it is possible to prevent the occurrence of liquid-marks on the wafers W, which may be caused by re-attachment of droplets falling off the nozzles 81a to 81c onto the wafers W at the drying process of the wafers W subsequent to ejection of various treatment liquids.

It should be noted that an air current is produced in the processing space of the chamber 82 in the rotating direction of the wafers W because they are rotated at the "liquid treatment" processes to eject various treatment liquids and also the sequent drying processes. Particularly, if the treatment liquid adheres to the nozzles 81a to 81c in case of drying the wafers W, there is a possibility of liquid-marks appearing on the wafers W since the adhesive liquid is scattered by the above air current, being capable of occurrence of inferior products.

Providing that the wafers W are rotated in the counterclockwise direction shown with an arrow R of FIG. 11, the nozzle 81a being downwind of the air current by the rotating wafers W is preferably arranged out of the above wafers' "upside" area and also arranged in the "upper" area above the above horizontal plane, in order to prevent the occurrence of liquid-marks on the wafers W due to the droplets of treatment liquid.

For example, in FIG. 11, the discharging nozzle 81a is arranged in a position intersecting the two-dotted line HH at an angle of about 45 degrees, while the discharging nozzle 81b is arranged in a position intersecting the two-dotted line HH at an angle of about 30 degrees. Nevertheless, in view that the so-established angles are changeable in accordance with an inner diameter of the cylindrical part of the chamber 82, diameters of the wafers W being processed and configurations of the nozzles 81a and 81b, the discharge nozzle 81 may be arranged in a higher position so as to intersect the two-dotted line HH at an angle of about 60 degrees.

On the other hand, as to the discharging nozzle being upwind of the air current by the rotating wafers W, for example, the nozzle 81c in FIG. 11, it is desirable to arrange the same nozzle in a lower position close to the horizontal plane intersecting the two-dotted line HH at an angle less than about 30 degrees. In such a case, even if the treatment liquid adhering to the nozzle 81c is blown toward the wafers W by the air current, the so-blown liquid falls downward without adhering to the wafers W.

As mentioned above, it is preferable to position the discharging nozzle above the horizontal plane, such as the above-mentioned nozzles 81a to 81c. Nevertheless, unless blowing up the flowing or falling treatment liquid again, a nozzle may be disposed in an area somewhat lower than the horizontal plane, for example, a position intersecting the two-dotted line HH at an angle less than about 10 degrees, as shown by a discharging nozzle 81d of FIG. 11.

As one example of the process sequence employing the arrangement of nozzles shown in FIG. 11, considering that the chemical treatment, IPA cleaning, rising with pure water and drying are performed in order, it is advantageous to use the discharging nozzle 81a ejecting the treatment liquid in a plane when using the chemical liquids and IPA and also advantageous to use the nozzles 81b, 81c each ejecting the treatment liquid in a conical shape when using the pure water. In such a case, then it is possible to effectively complete the liquid treatment in a short period while saving the consumption of the treatment liquid. Noted, the discharging nozzle ejecting the treatment liquid in a plane may be employed for the nozzles 81b, 81c.

The above-mentioned circumferential positioning of the discharging nozzles mainly comes into question against the outer chamber and does not come into question against the inner chamber particularly. The reason is that since the drying process is not carried out in the inner chamber, there is no need to put the treatment liquid's dribbling from the orifices in question.

In the above-mentioned embodiments, the plane ejected liquid(s) is hit against the substantial centers of the wafers W at the designated angle while directing their processing surfaces on one side. While, in the modification, the treatment liquid may be ejected in a manner that the plane of the plane ejected liquid is generally parallel with the processing surfaces of the wafers W.

Figure 12A:
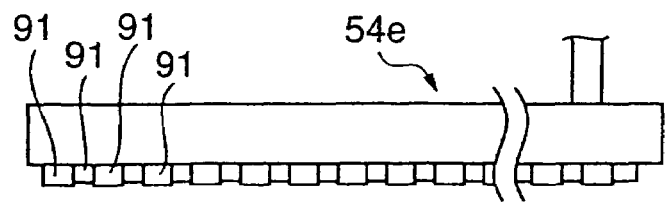
FIG. 12A is a front view showing a further embodiment of the discharge nozzle.
Figure 12B:
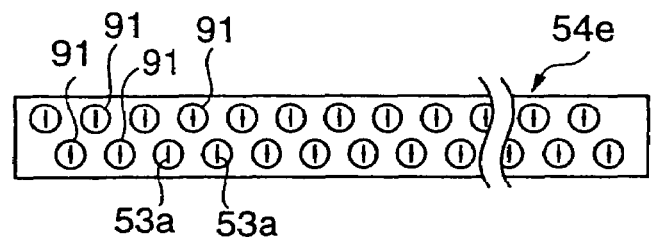
FIG. 12B is a bottom view of the discharge nozzle of FIG. 12A.

FIG. 12A is a plan view of a discharging nozzle 54e. FIG. 12B is a front view of the same nozzle 54e. Although the shown discharging nozzle 54e employs the members 91 which are identical to those attached to the previous nozzle 54a, the pedestal having the members 91 attached thereon is formed with no inclination. Each member 91 has the ejecting orifice 53 formed to eject the plane ejected liquid 99, which is similar to the above case of the nozzle 54a. Although FIG. 12A illustrates the members 91 which can be divided into two groups (rows) of different heights, of course, the members 91 may be equalized with each other in height alternatively.

Figures 13A, 13B:
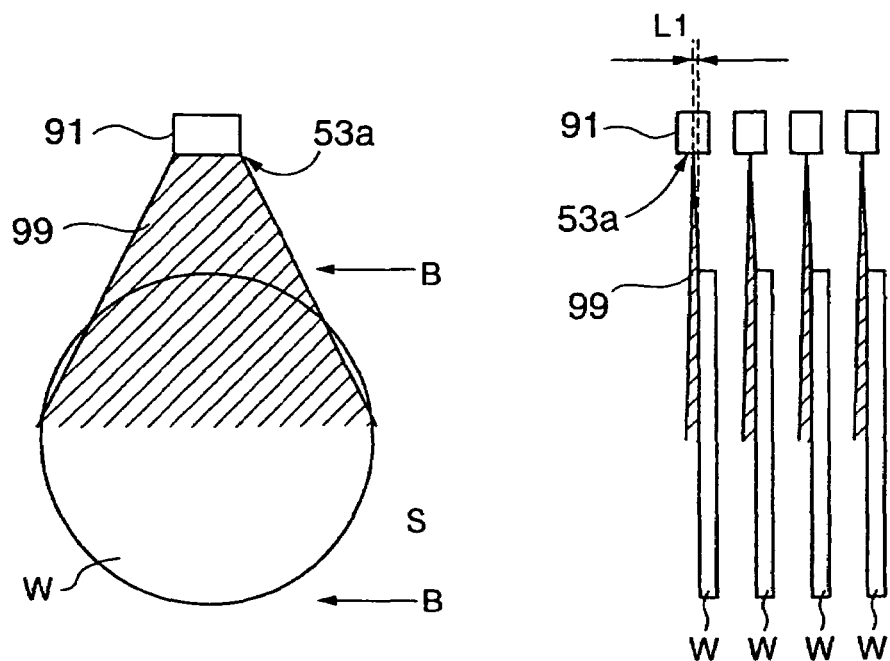
FIG. 13A is a view showing the treatment liquid ejected from the discharge nozzle of FIG. 12A from the axial direction of the wafer.
FIG. 13B is a view from the directions of arrows A, A of FIG. 13A.

In order to allow the plane ejected liquid 99, which has been elected in substantially parallel with the processing surface of each wafer W, to hit thereon effectively, it is desirable to establish an appropriate horizontal distance L1 between the processing surface of one wafer W and the ejecting orifice 53a, as shown in FIGS. 13A and 13B (similar to FIGS. 8A and 8B). Thus, considering the liquid's thickness where the liquid 99 attacks against the wafer W, the above distance L1 has an appropriate value established so as not to increase the plane ejected liquid 99 hitting on the side face of the wafer W excessively while the plane ejected liquid 99 not hitting on the wafer W but falling into drainage is not increased in quantity.

If the plane ejected liquid 99 is discharged close to the processing surface of the wafer W, then the same liquid 99 is attracted to the wafer W by an electrostatic force etc. thereby to moisten the wafer W. Additionally, the plane ejected liquid 99 collides with a complicated flow of the treatment liquid caused by the rotation of the wafers W. In this way, the efficiency in utilizing the treatment liquid as above does not deteriorate so much in comparison with the previous case of applying the liquid 99 on the wafer W at the designated angles, but exhibits a greatly improvement in comparison with the conventional case of ejecting the treatment liquid conically.

As mentioned above, when ejecting the plane ejected liquid 99 in a manner that its ejecting surface is generally parallel with the processing surface of each wafer W, the liquid treatment may be carried out while holding the wafers W at regular intervals so that the processing surfaces of the adjoining ones oppose each other in substantially parallel. In such a case, it is possible to make the discharging nozzle compact since it is provided with the ejecting orifices each taking charge of two adjoining wafers W. In a further modification, the distance between the adjoining ones of the wafers W may be reduced while taking care of the interference therebetween. Then, it is possible to miniaturize the processing chamber.

Different from the ejection forms shown in FIGS. 8A, 10B and 13A, FIG. 14 illustrates a further form to allow a plane ejected liquid 113 to hit against a radial area 115 defined on each wafer W. In this arrangement, the wafer W is rotated so that the direction of the so-ejected liquid is opposite to the wafer's circumferential velocity (v) in the area 115. According to the arrangement, there can be realized, in the area 115, a high relative-speed as a result of an addition of the circumferential velocity (v) to the ejecting velocity of the liquid. Accordingly, it is possible to progress the cleaning effect of the apparatus.

FIGS. 15A and 15B are explanatory view showing the relationship between the adjoining wafers W in pairs and the single ejecting orifice 53a and the ejecting form of the plane ejected liquid 99. FIG. 15A is a diagram viewed in a direction perpendicular to the processing surface of the wafer W. FIG. 16B is a diagram viewed from directions of arrows D, D. The ejecting orifice 53a is arranged over a middle position between the wafers W in pairs. The direction of the ejecting orifice 53a is adjusted so that the plane ejected liquid 99 hits on both of the processing surface of two wafers W at a constant angle β for each processing surface. According to the ejecting form in the form of a fan, the treatment liquid is ejected to splash the central portion of the wafers W with a predetermined thickness.

Also in this case, since the treatment liquid is ejected close to the processing surfaces of the wafers W, then the same liquid is attracted to the wafers W by the electrostatic force etc. thereby to moisten the wafers W. Additionally, since the ejected liquid collides with the complicated flow of the treatment liquid caused by the rotation of the wafers W, the processing surfaces of the wafers W in pairs are subjected to simultaneous liquid treatment. Then, it is possible to halve the number of nozzles, being accompanied with the reduction in manufacturing cost. On the other hand, since the treatment liquid hitting on the side faces of the wafers is reduced in quantity, the efficiency in using the treatment liquid can be improved. Besides, in case of a small distance between two adjoining wafers W, the treatment liquid may be ejected so that the plane of the plane ejected liquid 99 is substantially parallel with the processing surfaces of the wafers W.

In common with various embodiments mentioned above, it should be noted that if the ejected treatment liquid has a high electric resistance, for example, in case of using the pure water for cleaning as the treatment liquid, there is a possibility that the wafers W are damaged due to the occurrence of static electricity. Therefore, for example, by dissolving carbon dioxide ($CO_2$) into the treatment liquid, it is desirable to restrict the occurrence of static electricity in view of avoiding the damage on the wafers W.

Although there exists a method of using a reverse-osmosis film in order to dissolve carbon dioxide ($CO_2$) in the treatment liquid, there may be alternatively employed another method of feeding carbon dioxide ($CO_2$) into a pressure-rising pump for feeding the treatment liquid, such as a turbine pump. In the method, it is further executed to stir and mix the so-fed carbon dioxide ($CO_2$) in the pump while utilizing the pressure-rising operation of the pump. Then, it is possible to save both installation cost and running cost for the apparatus with no use of reverse-osmosis film.

Although a variety of embodiments of the invention have been described, it goes without saying that the present invention is not limited to the above embodiments but various modifications. For example, although the liquid treatment is carried out with two chambers, i.e. the outer chamber 26 and the inner chamber 27 in the above-mentioned embodiments, these chambers may be replaced by a single chamber. Alternatively, three chambers may take charge of them. Again, although the above-mentioned embodiments of the invention are related to a cleaning apparatus, the present invention is also applicable to other liquid treatments, for example, coating of a designated liquid on the substrates. Further, besides the application for semiconductor wafers, the present invention is also applicable for processing other substrates, such as substrates for a liquid crystal device (LCD).

As mentioned above, according to the present invention, since the treatment liquid is ejected to the processing surfaces of the respective substrates as targets, it is possible to reduce the quantity of treatment liquid, which has been attacked against the side faces of the substrates and subsequently discharged conventionally, and also possible to perform the uniform liquid treatment to the whole substrates in a short period while removing contaminations from the surfaces of the substrates effectively. Consequently, the invention has a remarkable effect to reduce both cost of materials and running cost in connection with the liquid treatment. Furthermore, in case of processing the substrates while opposing the processing surfaces with each other, it is possible to halve the number of ejecting orifices formed in the discharging nozzle (i.e. the liquid supplying mechanism), allowing it to be compact in size. Correspondingly, the manufacturing cost of the discharging nozzle itself can be reduced to realize an improved space utility of the processing chamber. Additionally, by shortening the interval of the substrates, the processing chamber can be small-sized to progress the miniaturization of the liquid processing apparatus itself.

What is claimed is:

1. A liquid processing apparatus comprising;
a processing container formed so as to surround a processing chamber in which a plurality of substrates are accommodated with their surfaces to be processed arranged generally parallel with each other, central axes of the substrates being a horizontal direction;
a plane nozzle for supplying the substrates with a chemical liquid thereby to carry out a chemical treatment, the plane nozzle having ejecting plane orifices juxtaposed with the plural substrates to eject the chemical liquid in the form of a plane, and
a conical-shaped nozzle for supplying the substrates with water thereby to carry out rinsing, the conical-shaped nozzle having ejecting conical orifices to eject water in the form of a conical-shape, wherein
the plane ejecting orifices are arranged (i) above a horizontal plane including the central axes of the substrates to be processed and (ii) outside of an upper projection of the substrates,
whereby droplets of chemical liquid falling from the plane ejecting nozzles will not interfere with the substrates.

2. A liquid processing apparatus as claimed in claim 1, wherein the substrates are arranged so as to be rotatable about substantial centers thereof.

3. A liquid processing apparatus as claimed in claim 2, wherein the plane nozzle is formed so as to eject the chemical liquid obliquely to the processing surfaces of the plural substrates and also hit the chemical liquid on substantial centers of the substrates.

4. A liquid processing apparatus as claimed in claim 3, wherein each of the substrates is in the form of a circular plate; and the chemical liquid is ejected against each processing surface of the substrates so that a width of the plane-ejected chemical liquid is generally equal to the diameter of the substrate, on the processing substrate.

5. A liquid processing apparatus as claimed in claim 3, wherein the plane nozzle has a nozzle body having the plane ejecting orifices formed therein, the plane ejecting orifices being inclined so as to eject the chemical liquid obliquely to the processing surfaces of the substrates.

6. A liquid processing apparatus as claimed in claim 1, wherein the plane ejecting orifices are provided for the plural substrates, one by one.

7. A liquid processing apparatus as claimed in claim 6, wherein the plane nozzle includes a first nozzle and a second nozzle both of which are separated from each other in the circumferential direction of the substrates, the first nozzle having a plurality of first ejecting orifices to eject the chemical liquid to alternatively-positioned ones of the plural substrates to be processed, and the second nozzle having a plurality of second ejecting orifices to eject the chemical liquid to alternately-positioned ones of the plural substrates except the alternately-positioned substrates charged by the first nozzle.

8. A liquid processing apparatus as claimed in claim 1, wherein the plane nozzle is formed so as to eject the chemical liquid among the plural substrates.

9. A liquid processing apparatus as claimed in claim 1, wherein the plane ejecting orifices are formed so as to eject the chemical liquid in a substantially fan-shaped pattern.

10. A liquid processing apparatus as claimed in claim 1, wherein each of the substrates is in the form of a circular plate; the substrates are juxtaposed in an axial direction thereof in such a way that processing surfaces of the substrates are arranged in parallel with each other; and the substrates are rotated about the axis thereof, the axis direction of the circular substrates being a horizontal direction.

* * * * *